United States Patent [19]

Houzay et al.

[11] Patent Number: 5,260,547
[45] Date of Patent: Nov. 9, 1993

[54] AUTONOMOUS CONTAINER FOR THE VACUUM TREATMENT OF AN OBJECT AND ITS TRANSFER LOCK

[75] Inventors: Françoise Houzay, Bagneux; Jean-Marie Moison, Croissy/Seine; Yves Nissim, Paris, all of France

[73] Assignee: France Telecom Etablissement Autonome de Droit Public, France

[21] Appl. No.: 848,254

[22] Filed: Mar. 9, 1992

[30] Foreign Application Priority Data

Mar. 14, 1991 [FR] France .................................. 91 03115

[51] Int. Cl.⁵ ........................................... C23C 16/00
[52] U.S. Cl. .................................. 219/390; 392/418; 414/939; 118/729
[58] Field of Search ............... 219/390, 388, 405, 411; 118/50.1, 724, 725, 728, 729; 392/416, 418; 414/DIG. 5

[56] References Cited

U.S. PATENT DOCUMENTS

| 2,212,330 | 8/1940 | Thomas | 392/416 |
| 4,030,622 | 6/1977 | Brooks | 118/50.1 |
| 4,137,865 | 2/1979 | Cho | 118/724 |
| 4,523,885 | 6/1985 | Bayne | 432/259 |
| 4,607,152 | 8/1986 | Allovon | 219/390 |
| 4,676,884 | 6/1987 | Dimock | 118/50.1 |
| 4,687,542 | 8/1987 | Davis | 118/729 |
| 4,721,836 | 1/1988 | Zeisse | 219/385 |
| 4,768,911 | 9/1988 | Balter | 414/DIG. 5 |
| 4,852,516 | 8/1989 | Rubin et al. | 118/719 |
| 4,861,563 | 8/1989 | Shekerjian et al. | 414/DIG. 5 |
| 4,952,299 | 8/1990 | Chrisos et al. | 414/DIG. 5 |
| 4,976,612 | 12/1990 | Adams | 432/259 |
| 4,977,307 | 12/1990 | Motoi | 219/390 |
| 5,076,205 | 12/1991 | Vowles et al. | 118/715 |

FOREIGN PATENT DOCUMENTS 62-290126  12/1987  Japan .................................. 118/729
WO8809563  12/1988  PCT Int'l Appl. .

Primary Examiner—Bruce A. Reynolds
Assistant Examiner—John A. Jeffery
Attorney, Agent, or Firm—Pearne, Gordon, McCoy & Granger

[57] ABSTRACT

An antonomous container permits the vacuum transportation of any random small object and the performance of operations within a container (1) or lock (2), without it being necessary to transfer the object (10) into a working station (3). The container according to the invention is small and is provided with shielding windows (12). Therefore the object (10) can be observed within the container (1) during the operations performed within the said container (1). The latter can be transferred for supplementary operations with respect to the object (10) to the working station (3) by means of a manipulating rod (30). Application to the growth of integrated circuits in microelectronics.

8 Claims, 3 Drawing Sheets

AUTONOMOUS CONTAINER FOR THE VACUUM TREATMENT OF AN OBJECT AND ITS TRANSFER LOCK

FIELD OF THE INVENTION

The invention relates to the treatment in vacuo of objects and in particular the production of electronic or microelectronic components, such as integrated circuits for use in optoelectronics.

PRIOR ART

The technology for the production of integrated circuits for microelectronics and optoelectronics requires an ever cleaner environment with a view to obtaining an even better manufacturing efficiency. Thus, the components must not come into contact with impurities during their manufacture. Moreover, a certain number of them have interfaces with such sensitive optical and electronic properties that a passage in ambient air during manufacture becomes problematical. However, the production of such products involves several technological or analytical stages which have to be carried out at different stations.

In order to avoid transfers between the different stations taking place in ambient air, a first solution consists of reducing these transfers by maintaining the component to be treated under a vacuum at all times. This is carried out by connecting together the different stations, so as to form a working unit known as a "single machine", which is heavy and very difficult to manipulate, bearing in mind the diversity of the evolution and the security conditions of each station. Such machines can occupy a surface area of several dozen square meters.

A second solution consists of using the "suitcase" system for transporting the sample to be treated between the individual stations. Thus, containers are known which are able to transport samples in vacuo and which have for this purpose an autonomous vacuum unit. Generally, the transported sample is transferred from the container to a working station by means of a transfer lock.

The object of the invention is to supply an improved container permitting both the vacuum transfer of a sample between two stations and its transfer in the enclosure of said station, but also permitting the performance of certain operations from the actual container or in the transfer lock.

SUMMARY OF THE INVENTION

To this end, a first objective of the invention is an autonomous container for the vacuum transportation between the individual stations of an object to be treated during a series of operations and comprising a small enclosure having an opening to permit the introduction and removal of the object kept under vacuum by means of a pump supplied by an autonomous supply source and object handling means.

According to the invention the container comprises means for treating the object in the enclosure, tight bushings through the enclosure for the electrical conductors necessary for the treatment means, said treatments including the electrical characteristics, transparent viewing shielding windows for the observation and monitoring of the performance of the operations performed on the object in the enclosure and means for fixing the container to a transfer lock to a working station.

Inter alia, the shielding windows make it possible to carry out treatments by visible radiation. In this way the container is used both for the transportation and treatment of the object. The container enclosure preferably has a gas intake so as to permit a gas treatment of the object.

The container is advantageously completed by a lever for handling the object along a translation axis and to one end of which is fixed an object fixing platform, so as to be able to remove, reintroduce and turn the object along the translation axis for positioning the same inside and outside the enclosure.

So as to permit the vacuum transportation of the object, the platform preferably has a base having sealing means obstructing the opening of the enclosure when the platform is placed therein in order to enclose the object therein.

A fundamental construction of the container provides for the treatment means to be constituted by heating electrical elements.

In order to be able to carry out special optical observation operations within the enclosure, at least one shielding window is angularly positioned with the Brewster angle with respect to the platform about the translation axis.

A second main objective of the invention for the advantageous completion of the container relates to a transfer lock for an object placed in a container, like that described hereinbefore, for transferring the object to a working station and comprising a fixing flange on a working station and container reception means.

According to the invention, said lock also has viewing shielding windows for observing the object and for monitoring the performance of the operations carried out thereon in the lock.

The said lock is advantageously equipped with a transfer rod for passing the object from the container platform, when it is removed, into the working station, when the lock is fixed near the latter.

LIST OF DRAWINGS

The invention and its various technical characteristics will be better understood from reading the following explanatory, but nonlimitative description with reference to the attached drawings, wherein show:

FIG. 1, in section, the assembly of the container and the lock according to the invention.

FIG. 2, in section, the container according to the invention in the closed position.

FIG. 3, a plan view of the container only.

FIG. 4, a plan view corresponding to FIG. 3, but showing the container and the lock.

DETAILED DESCRIPTION OF AN EMBODIMENT OF THE INVENTION

Figure 1:
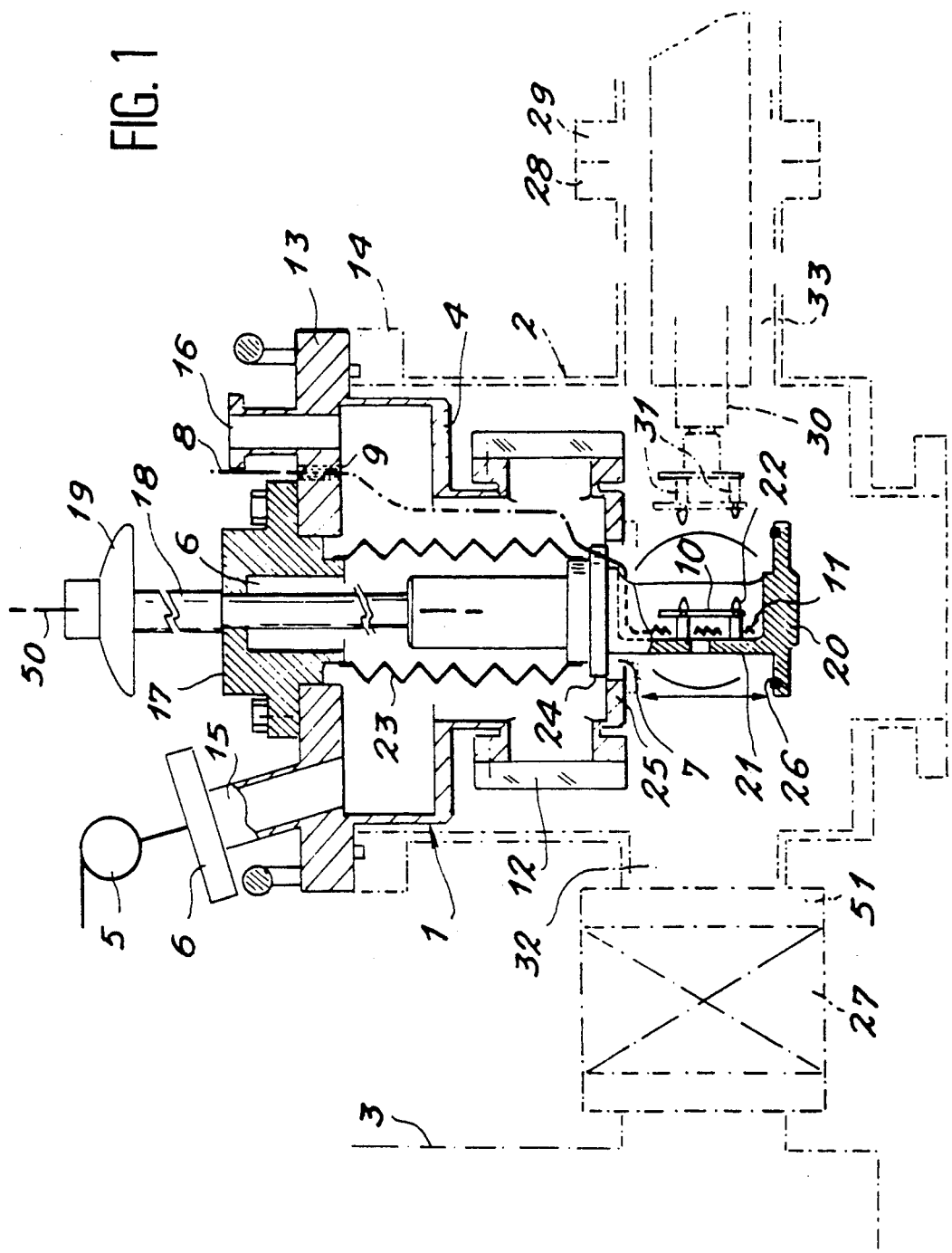

FIG. 1 shows the container 1 placed on a lock or lock chamber 2, said assembly being fixed to the intake of a working station 3. The container 1 is mainly formed by a tight enclosure 4, in which the vacuum can be formed by means of a pump 5 fixed via a flange 6.

The portable nature of the container 1 makes it necessary for the enclosure 4 to be of small size and for the pump 5 to have a limited weight. However, it must still make it possible to obtain a high vacuum within the enclosure 4 and to have a supply autonomy, i.e. a low consumption is required.

Within the scope of the application of the invention to the manufacture or construction of a microelectronics component, it is preferable to use an ionic pump with a pumping speed close to 10 liters per second. The pump 5 must have batteries and a high voltage converter and a consumption not exceeding 10 milliwatts. This type to pump is included in the catalogue of numerous manufacturers, including Meca 2000. The above indicated consumption makes it necessary for the pump to only operate under steady state conditions during the transportation of the container. The starting up of the pump 5 is then ensured by a conventional supply from the much more powerful mains.

In the lower part of the enclosure 4 is provided an opening 7 to permit the introduction into and removal from the container 1 of an object, such as a specimen or sample of a microelectronics circuit 10. The introduction and removal of the latter takes place with the aid of handling means, which will be described hereinafter.

According to the invention, treatment means for the object 10 are provided within the enclosure 4. One of the treatments involves the heating of the sample 10. Reference is also made to the treatment of the sample 10 by gases and visible radiation.

One treatment consisting of the heating of the sample 10 requires the supply of electric power within the enclosure 4. To this end there are electrical conductors 8 penetrating the enclosure 4 by at least one tight bushing 9, which can thus supply a heating element 11 located in the vicinity of the sample 10.

With a view to performing these different operations on the sample 10 within the enclosure 4, it is necessary to be able to monitor what is happening in the enclosure 4. According to the invention, the lateral part of the enclosure 4 has several viewing windows 12, which make it possible to observe the object 10, when it is enclosed within the enclosure 4, whilst also making it possible to carry out optical operations on said sample 10. An example of this operation is described in greater detail hereinafter.

The shielding windows 12 can be transparent to wavelengths other than visible wavelengths.

The container according to the invention is preferably made from stainless steel.

The positioning of the container 1 on the lock 2 obviously involves the presence of means for the fixing to the said lock 2. To this end, the enclosure 4 has an upper flange 13 making it possible to bear on a bearing surface 14 of the lock 2.

The handling means for the object 10 are also fixed to the upper flange 13. For this purpose, there is a central hole 6 in the upper flange 13 and on it can bear a ring 17 supporting a handling lever 18.

In the preferred construction of the enclosure 4, the placing under vacuum and the arrival of the special gases take place by means of two ducts 15,16 respectively.

As can be seen in FIG. 1, the handling lever 18 is installed in sliding manner in the ring 17 in accordance with a vertical translation axis 50. It is manipulated with the aid of a handle 19. Its translation is vertical when the container 1 is placed on the lock 2. Such a vertical translation makes it possible to remove an object 10 placed at the lower end of the lever 18 and to position it in the centre of the volume which has remained free in the lock 2.

A metal bellows 23 surrounds the lever 18 and is tightly fixed by its two ends both to the ring 17 and to a bearing surface 24 of the lever placed just above the vertical part 21.

When the lever 18 is lowered, i.e. the sample 10 is removed from the enclosure 4, the bearing surface 24 bears on the lower surface 25 of the enclosure 4 and thus determines the removal position of the object 10. However, when the latter is raised within the enclosure by means of the lever 18, the base 20 bears on the lower wall 25 and thus tightly closes the access hole 7 of the enclosure 4 by means of a sealing joint or gasket 26, which contacts both the base 20 and the part 25 of the enclosure 4. Thus, there is a complete seal with respect to the vacuum and any gases introduced into the enclosure.

The object 10 is preferably fixed to a platform 20 or to a vertical part 21 supporting the platform 20. In the embodiment shown in the drawing, the object is fixed to the vertical part 21. In this case it is a microelectronics circuit sample mounted on a sample holder having six holes angularly spaced from one another by 60°. The vertical part 21 in corresponding manner has three horizontal pins angularly spaced from one another by 120°. The sample 10 is fixed by the introduction of the three pins 22 into three of the six holes of the sample holder.

Figure 2:
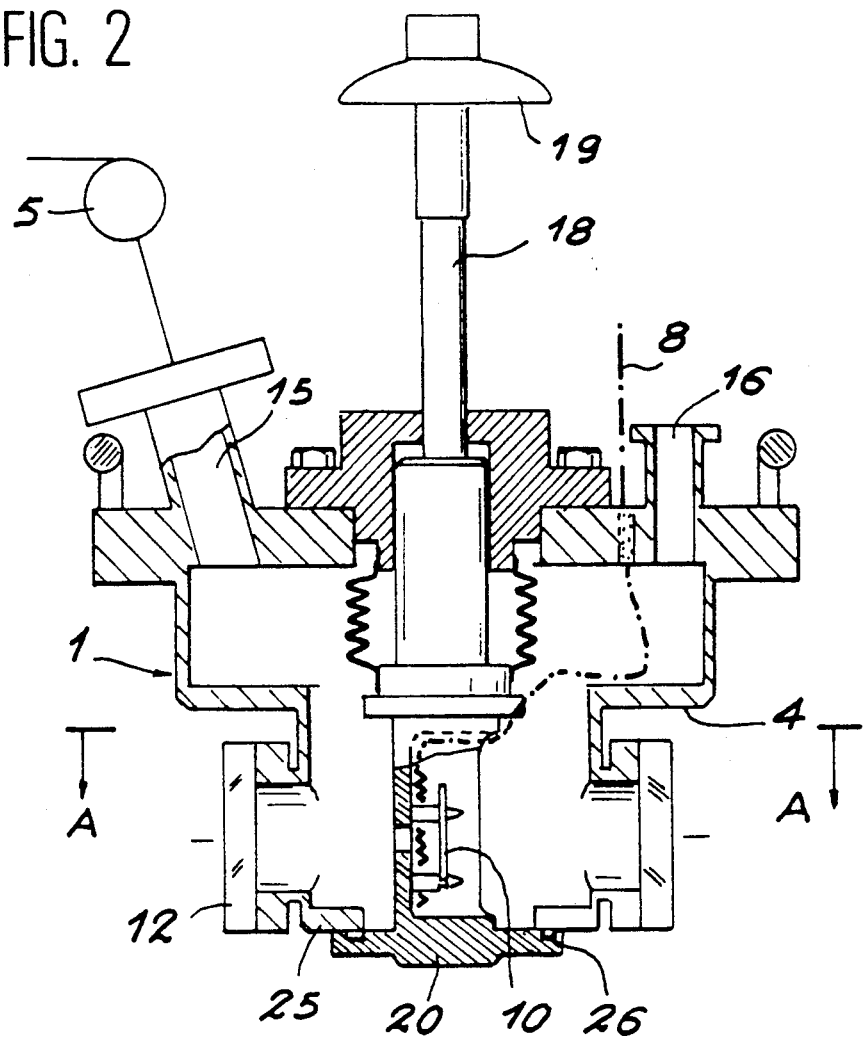

The container is shown alone in FIG. 2 in the closed position, i.e. its lower opening 7 is obstructed by the base 20 of the platform. The lever 18 is raised by means of the handle 19. The object 10 is then confined within the tight enclosure 4. The vacuum can then be formed by the pump 5 via the left-hand duct 15. Special gases for treating the object can also be introduced by the righthand duct 16.

Figure 3:
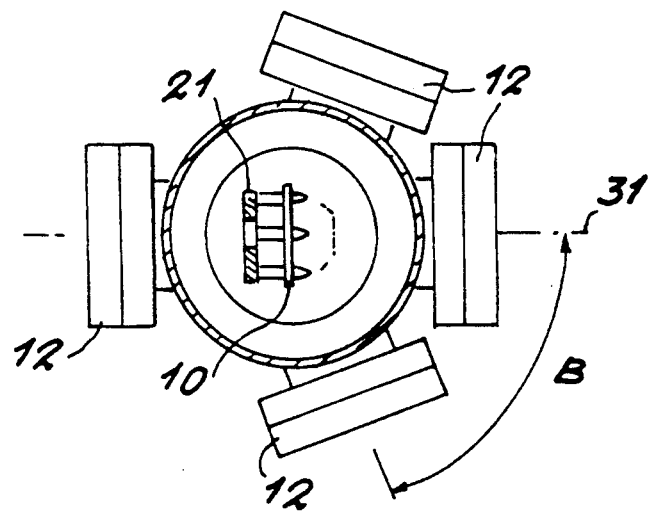

FIG. 3 is a section along line A—A of FIG. 2 through the lower part of the container. It is possible to see the location of the shielding windows 12 in a possible construction of the container according to the invention. Thus, for carrying out certain optical operations, such as spectrometry, it is of interest to position at least one of the windows 12 at a given angle, which is the Brewster reflection angle.

In the present construction said Brewster angle B is close to 70° relative to the observation or normal reflection axis 31. A second window can also be angularly positioned at the Brewster angle B on the other side of the normal reflection axis 31.

On returning to FIG. 1, the lock 20 has several outlets. On the left-hand side, a first outlet 32 consists of an outlet flange 51 for fixing to a valve 27 giving access to a working station 3. The sample 10 can then be brought to the said working station 3 in order to undergo therein one or more production operations. The horizontal translation of the sample 10 preferably takes place by means of a manipulating rod 30 positioned horizontally facing said first outlet 32 in a handling or manipulating duct 33. Such a tool is commercially available under the name ball guide mechanical rod and is in particular marketed by Meca 2000. It permits a horizontal displacement of 500 mm.

Figure 4:
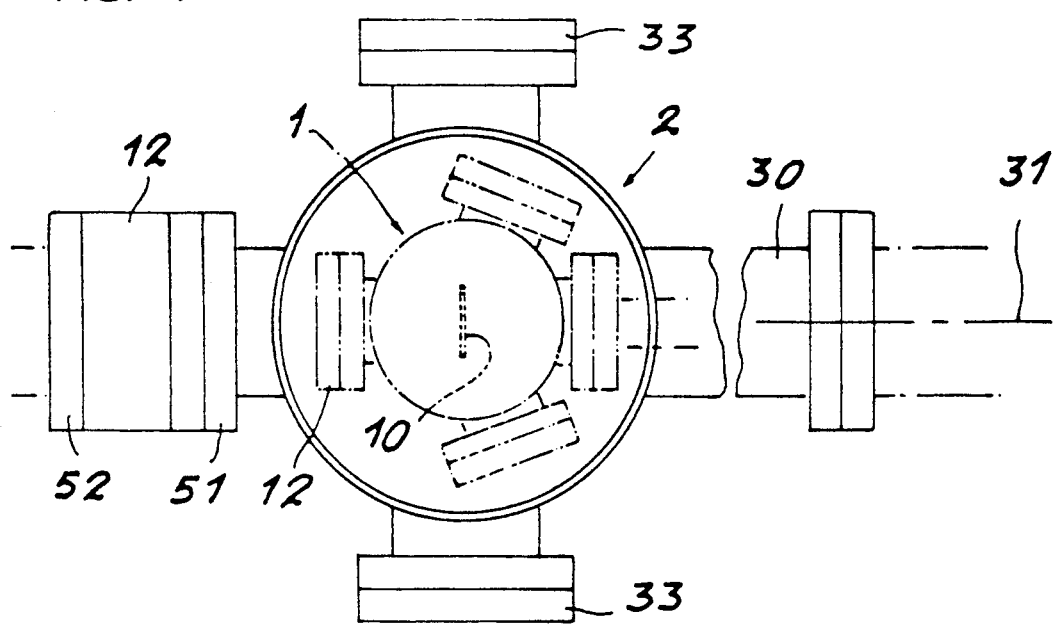

As is shown in FIG. 4, two lateral windows 33 can be placed on the lock so as to also permit the monitoring and performance of optical operations within the lock 2 and outside the container 1. One optical operation which can be carried out within the container 1 is infrared spectrometry. It is also possible to carry out electrical analyses, such as the measurement of electrical characteristics on the basis of a "current specimen".

Other optical operations can be carried out with the container 1 and without the lock 2. Reference is e.g.

made to photoluminescence from ambient temperature to the temperature of nitrogen (efficiency cartography, spectrometry, decay measurement), Raman spectroscopy, Fourier transform infrared spectroscopy and electrical measurements. All these procedures in particular permit the in situ monitoring of the growth, i.e. deposit of a microelectronic circuit.

The operations to be performed in vacuo, i.e. from the container 1 and the lock 2, are e.g. electronic microscopy, electronic masking and ionic implantation, where the container serves as an annealing furnace under a controlled atmosphere. The container 1 can also serve as a plasma chamber.

A more specific example of application can be given. This relates to the production of a structure for a microoptoelectronic component having a III-V heterostructure, passivation layers and MIS, MES or ohmic contacts. Such a process comprises the following stages:

production of the heterostructure in an epitaxy frame or support by molecular beams or the like (chemical beams, MOCUD);

transfer to the portable container;

dielectric deposit with or without metal in the container 1;

transfer to an implantation, etching or other frame; and return to the portable container 1 for analysis and continuation of the process.

At any time it is possible to perform characterization, e.g. by Auger spectrometry in an analysis frame and in situ characterization in the container, e.g. by infrared spectrometry or photoluminescence.

The invention leads to the following advantages. There is an improvement to the quality of the sample and the interfaces between the different layers. Thus, the sample 10 is kept in vacuo, so that no natural oxide formation occurs. The surface of a III-V-type heterostructure contaminated in this way has to be chemically cleaned prior to the deposition of the following layer. This operation takes a long time, is complicated and is never perfect, the surface still having time to become contaminated prior to the introduction into the treatment frame. There is a cost saving and an improvement in the safety of the installation by replacing the single machine, which is very voluminous, onerous and requires the presence at the same location of all the frames necessary for each operation in the process. Safety problems more particularly associated with arsenic and hydrides occur. Each frame must have a personalized lock chamber. It is possible to better follow the production process. Thus, at each stage, the samples can be analysed by various electronic and optical procedures without any deterioration to the sample. The container according to the invention also facilitates the storage of several samples in a frame within the production process, so as to form batches.

The construction described hereinbefore is only an example. Thus, the positions of the valves and the different accesses to the working stations can be very different without changing the design of the container according to the invention.

We claim:

1. An autonomous container (1) for vacuum transportation from one station to another of an object (10) to be treated during a series of operations comprising a small enclosure (4) having an opening (7) for introduction and removal of the object (10), said enclosure being kept under a vacuum by means of a pump (5) supplied by an autonomous supply source and having means for handling the object (10), characterized in that the container has means for treating the object (10) in the enclosure (4), at least one tight bushing (7) through the enclosure (4) to permit passage through the latter of at least one electrical conductor (8) required by the treatment means, shielded viewing windows (12) transparent to certain wavelengths for observing the object (10) and for monitoring the performance of the operations around said object (10) in the enclosure (4), and means for removably fixing the container (1) to a transfer lock (2) for transfer of the object (10) to a working station (3).

2. A container (1) according to claim 1, characterized in that the container has at least one gas intake (16) in the enclosure (4).

3. A container (1) according to claim 1, characterized in that the container has a handling lever (18) along a translation axis (50), to one end of which is fixed a platform (20, 21) for the object (10) for the removal, return and turning of the object (10) along the translation axis (50), in order to position the object inside and outside the enclosure (4).

4. A container (1) according to claim 3, characterized in that the platform (20, 21) has a base (20) equipped with sealing means (26), which close the opening (7) of the enclosure (4) when the platform (20, 21) is placed in the enclosure (4) in order to contain the object (10) therein and to permit the vacuum transportation of said object (10).

5. A container (1) according to claim 1, characterized in that the means for treating are constituted by at least one electric heating element (11), a gas intake and visible radiation facilities.

6. A container (1) according to claim 1, characterized in that at least one shielding window (12) is positioned angularly at a Brewster angle relative to the object (10), about a translation axis (50) with respect to the object handling means.

7. A container (1) according to any one of the preceding claims comprising a fixing flange (51) on the working station (3) and reception means (14) on the transfer lock for the container (1), characterized in that the transfer lock has viewing windows (33) for observation of the object (10) and for monitoring performance of the operation carried out around the object (10) in the lock (2).

8. A container according to claim 7, characterized in that the transfer lock has a handling rod (30) for passing the object (10) from the object handling means of the container (1) when removed into a working station (3) when the lock (2) is fixed around the working station.

* * * * *